United States Patent [19]
Saeki

[11] Patent Number: 5,652,731
[45] Date of Patent: Jul. 29, 1997

[54] SEMICONDUCTOR MEMORY DEVICE INCLUDING DIVISIONAL DECODER CIRCUIT COMPOSED OF NMOS TRANSISTORS

[75] Inventor: Takanori Saeki, Tokyo, Japan

[73] Assignee: NEC Corporation, Tokyo, Japan

[21] Appl. No.: 691,591

[22] Filed: Aug. 2, 1996

[30] Foreign Application Priority Data

Aug. 17, 1995 [JP] Japan ................................. 7-208947

[51] Int. Cl.$^6$ .................................................. G11C 8/00
[52] U.S. Cl. ................... 365/230.06; 365/63; 365/230.01
[58] Field of Search ........................ 365/230.06, 230.01, 365/230.03, 63

[56] References Cited

U.S. PATENT DOCUMENTS

| | | | |
|---|---|---|---|
| 4,958,326 | 9/1990 | Sakurai | 365/218 |
| 5,282,175 | 1/1994 | Fujita et al. | 365/230.06 |
| 5,467,032 | 11/1995 | Lee | 365/230.06 |
| 5,587,959 | 12/1996 | Tsukude | 365/230.06 |
| 5,596,542 | 1/1997 | Sugibayashi et al. | 365/230.06 |

OTHER PUBLICATIONS

K. Noda et al, "A Boosted Dual Word-line Decoding Scheme for 256Mb DRAMs", *1992 Symposium on VLSI Circuits Digest of Technical Papers*, pp. 112 and 113.
R.D. Isaac et al., *Nikkei Microdevices*, Nov. 1993, pp. 38–45.
H.J. Yoo et al., "A 150MHz 8-Banks 256M Synchronous DRAM with Wave Pipelining Methods", *1995 IEEE International Solid-State Circuits Conference*, Feb. 1995, pp. 250–251.

Primary Examiner—David C. Nelms
Assistant Examiner—F. Niransan
Attorney, Agent, or Firm—Young & Thompson

[57] ABSTRACT

A semiconductor memory device includes a series circuit composed of a drive MOS transistor as a first MOS transistor and a reset MOS transistor as a second MOS transistor connected in series via a common connection node, a source of the reset MOS transistor being connected to a lower potential power supply, a main word line, and a sub-word line connected to the common connection node. An address signal includes a first part and a second part and a row address signal section decodes the first part of the address signal to generate a first row address signal and a second row address signal having a phase inverse to that of the first row address signal in accordance with the decoding result, and supplies the first row address signal to a drain of the drive MOS transistor and the second row address signal to a gate of a reset MOS transistor. A main decoder circuit decodes the second part of the address signal to output a main word line signal to the main word line in accordance with the decoding result before the row address signal section supplies the first and second row address signals. A third MOS transistor as a transfer section transfers the main word line signal to a gate of the drive MOS transistor. A fourth MOS transistor as a preventing section is provided to prevent the sub-word line from floating when there is no main word line signal and the source MOS transistor includes a gate connected to the first row address signal, a drain connected to the main word line, and a source connected to the common connection node.

21 Claims, 7 Drawing Sheets

Fig. 10

| MW | RA | SW | PULL UP/DOWN | PATH |
|----|----|----|--------------|------|
| H | H | H | PULL UP | a |
| H | L | L | PULL DOWN | a, b |
| L | L | L | PULL DOWN | b |
| L | H | L | PULL DOWN | c |

5,652,731

1

SEMICONDUCTOR MEMORY DEVICE INCLUDING DIVISIONAL DECODER CIRCUIT COMPOSED OF NMOS TRANSISTORS

BACKGROUND OF THE INVENTION

1. Field of the Invention

The present invention relates to a semiconductor memory device, and more particularly to a semiconductor memory device in which word lines are grouped into main word lines and sub-word lines such that the main word line is driven by a main decoder circuit and the sub-word line is driven by a divisional decoder circuit in a DRAM (dynamic RAM).

2. Description of Related Art

As shown in FIG. 1, as a large capacity of DRAM is developed, there is proposed a semiconductor memory device in which word lines are grouped into a group of main word lines 12-1 and 12-2 and a group of sub-word lines 13-1 through 13-16 such that the word lines are hierarchized. The main word lines 12-1 and 12-2 are driven by the outputs of main X decoders 14-1 and 14-2, respectively, and the sub-word lines 13-1 through 13-16 are driven by the outputs of divisional decoders 15-1 through 15-16, respectively. The main X decoder 14-1 decodes address signals on row address lines 10-1, 10-3, and 10-4 to drive the main word line 12-1, and the main X decoder 14-2 decodes address signals on row address lines 10-2, 10-3, and 10-4 to drive the main word line 12-2. The divisional decoder 15-1 decodes signals on the main word line 12-1 and a part of remaining row address lines 11-1 to drive the sub-word line 13-1. A divisional decoder 15-2 decodes signals on the main word line 12-1 and a part of remaining row address lines 11-2 to drive the sub-word line 13-2. The other divisional decoder 15-3 through 15-16 decode signals on corresponding word lines and corresponding parts of remaining row address lines in the same manner to drive corresponding sub-word lines, respectively, as shown in the figure.

As examples of the circuit structure of the divisional decoders 15-1 to 15-16, there are proposed three types of circuit structure and these circuit examples are shown in FIGS. 2, 4 and 6, respectively.

First, the circuit shown in FIG. 2 is disclosed in "A boosted Dual Word-line Decoding Scheme for 256 Mb Drams", (Symposium on VLSI circuits Digest of Technical Papers, pp. 112–113, 1992) and is composed of three NMOS transistors 151 to 153. The transistor 151 is a drive transistor for driving the sub-word line SW to the potential of a selected state. The transistor 152 is a reset transistor for resetting the sub-word line SW to the potential of a non-selected state (the ground potential). The transistor 153 is a transfer gate transistor for transferring the potential of a main word line MW to the gate of the drive transistor 151. The gate of this transistor 153 is applied with a fixed potential VB enough to make this transistor 153 always turn on and an address signal RA is supplied to the drain of the transistor 151. Also, the gate of the transistor 152 is applied with a signal having a phase inverse to the main address line MW. Thus, the sub-word line SW is driven by a common connection node of the source of the transistor 151 and the drain of the transistor 152.

FIG. 3 shows examples of signal wave forms of the respective points of the circuit shown in FIG. 2. In a case where the sub-word line SW is to be set to the selected state, the potential of the main word line MW is first set to the H level (high level; the power supply voltage level VB) and at the same time, the potential of the inverse phase signal of a

2 signal on the main word line MW is set to the L level (low level; the ground level) (It is shown in FIG. 3 as the inverted MW and the H level is VCC and VCC<VB is satisfied). Thereafter, the address signal RA is set to the H level so that the sub-word line SW is driven to the H level. As a result, the selected state is achieved. The potential of the gate N2 of the transistor 151 is raised higher than the VB level by the operation of the transfer gate transistor 153 (i.e., it is boosted). Therefore, the source potential of the transistor 151, i.e., the potential of the sub-word line SW is sufficiently driven to the H level.

In a case where the sub-word line SW is to be set to the non-selected state, the potential of the main word line MW is set to the L level and the phase inverted signal is set to the H level.

The circuit shown in FIG. 4 is disclosed in Nikkei Microdevices (November, 1993) and is composed of the two NMOS transistors 255 and 256 and one PMOS transistor 254. The transistor 254 is a drive transistor for driving a sub-word line SW to a selected state. The transistor 256 is a reset transistor for resetting the sub-word line SW to a non-selected state. The transistor 55 is a floating prevention transistor for preventing floating to the sub-word line SW. The gate of the transistor 254 is directly supplied with the potential of the main word line MW and an address signal RA is supplied to the source of the transistor 254. The potential of the main word line MW is supplied to the gate of the transistor 255 and the phase inverted signal (inverted RA) of the address signal RA is supplied to the gate of the transistor 256. The sub-word line SW is connected to the common drain of the transistors 254 to 256.

FIG. 5 shows examples of wave forms of respective portions of the circuit shown in FIG. 4. In a case where the sub-word line SW is to be set to the selected state, the address signal RA is first set to the H level. At the same time, the phase inverted signal (inverted RA) is set to the L level. Further, the potential of the main word line MW is set to the L level.

In a case where the sub-word line SW is to be set to a non-selected state, the address signal RA is set to the L level and the phase inverted signal is set to the H level.

In a case where the sub-word line is to be held in the L level (the non-selected state), the main word line MW is maintained at the H level, thereby the sub-word line SW is maintained at the L level by the transistor 255 which makes it possible to prevent floating.

The circuit shown in FIG. 6 is disclosed in "A 150 MHz 8-Banks 256M Synchronous DRAM with Wave Pipelining Methods" (ISSCC Digest of Technical Papers, pp. 250–251, Feb., 1995) and is composed of three NMOS transistors 357 to 359. The transistor 357 is a transistor for driving a sub-word line SW to a selected state and the transistor 359 is a transistor for transferring an address signal RA to the gate of the transistor 357. The transistor 358 is a transistor for resetting the sub-word line SW to a non-selected state. The main word line MW is connected to the drain of the transistor 357 and the phase inverted signal of the address signal RA is applied to the gate of the transistor 358. The gate of the transistor 359 is applied with a potential VB enough to make this transistor always turn on and the address signal RA is applied to the drain of this transistor. The sub-word line SW is driven by the common connection node of the source of the transistor 357 and the drain of the transistor 358.

FIG. 7 shows examples of wave forms of the respective portion of the circuit shown in FIG. 6. In a case where the sub-word line SW is to be set to the selected state, the main word line MW is first set to the H level and then the address signal RA is set to the H level. At the same time, the phase inverted signal is set to the L level. Upon selection of the sub-word line SW, the potential N3 of the gate of the transistor 357 is raised higher than the VB level by the operation of the transfer gate transistor 359 (i.e., it is boosted). Therefore, the source potential of the transistor 357, i.e. the potential of the sub-word line SW is sufficiently set to the H level.

In a case where the sub-word line SW is to be set to the non-selected state, the address signal RA is set to the L level and the phase inverted signal is set to the H level.

In a case where the sub-word line SW is to be held at the non-selected state, the address signal RA is set to the L level and the phase inverted signal is set to the H level.

In the divisional decoder shown in FIG. 2, the signal having a phase inverse to a signal on the main word line MW, (i.e., an inverted MW) is used. Therefore, there is a problem in that the fault current such as a small leak current between the main word lines MW and the phase inverted signal line, and a short circuit current which is due to the short-circuiting between them can not be relieved.

In the circuit shown in FIG. 4, there is a drawback in that because the CMOS structure which uses the P-type MOS transistors and the N-type MOS transistors is employed, the PN separating area is necessary for the separation between a P-type well and an N-type well on a semiconductor substrate so that the chip area is increased when the circuit is achieved as an IC.

In the circuit shown in FIG. 6, because the structure that the address signal RA is inputted to the gate of the transistor 357 is adopted, the load capacity of the address signal RA becomes large. Therefore, it is necessary to make a drive circuit of the address signal RA large, so that it also causes the increase of the chip area.

SUMMARY OF THE INVENTION

An object of the present invention is to provide a semiconductor memory device which can be composed of transistor elements of an identical conductive type, and in which the address signal can be inputted to the drain of the transistor element such that increase of a chip area can be suppressed in case of making the whole circuit as an IC.

Another object of the present invention is to provide a semiconductor memory device in which a signal having a phase inverse to a signal of a main word line is not used.

In order to achieve an aspect of the present invention, a semiconductor memory device includes a main word line, a sub-word line, a main decoder circuit for decoding a first part of an address signal to output a main word line signal to the main word line in accordance with the decoding result, the address signal including the first part and a second part, an address signal decoding section for decoding a part of the second part of the address signal to generate a first row address signal and a second row address signal including the first part and a second part, a main decoder circuit for decoding the second part of the address signal to output a main word line signal to the main word line in accordance with the decoding result before the row address signal section supplies the first and second row address signals, and a transfer section for transferring the main word line signal to a gate of the drive MOS transistor.

The row address signal section may further includes a section for boosting a high level of the second row address signal to a boosted voltage higher than a higher potential power supply. In this case, a transfer MOS transistor of the transfer section has a gate is connected to the second row address signal, a drain connected to the main word line and a source connected to a gate of the drive MOS transistor.

Alternatively, the transfer section may include a transfer MOS transistor having a gate is connected to a predetermined voltage higher than a higher potential power supply, a drain connected to the main word line and a source connected to a gate of the drive MOS transistor.

The semiconductor memory device may further include a preventing section in order to preventing the sub-word line from floating when there is no main word line signal. In this case, the preventing section includes a floating prevention MOS transistor having a gate connected to the first row address signal, a drain connected to the main word line, and a source connected to the common connection node.

It is preferable that All of the MOS transistor having a phase inverse to that of the first row address signal in accordance with the decoding result, a first MOS transistor element having a gate connected to a predetermined voltage, a drain connected to the main word line and a source, a second MOS transistor element having a gate connected to the source of the first MOS transistor, a drain connected to the first row address signal, and a source connected to a common connection node, and a third MOS transistor having a gate connected to the second address signal, a drain connected to the common connection node and a source connected to a ground potential.

The semiconductor memory device may further includes a fourth MOS transistor element having a gate connected to the first row address signal, a drain connected to the main word line, and a source connected to the common connection node.

In order to achieve another aspect of the present invention, a semiconductor memory device includes a main word line, a sub-word line, a main decoder circuit for decoding a first part of an address signal to output a main word line signal to the main word line in accordance with the decoding result, the address signal including the first part and a second part, an address signal decoding section for decoding a part of the second part of the address signal to generate a first row address signal and a second row address signal having a phase inverse to that of the first row address signal in accordance with the decoding result, a first MOS transistor element having a gate connected to the first row address signal, a drain connected to the main word line and a source, a second MOS transistor element having a gate connected to the source of the first MOS transistor, a drain connected to the first row address signal, and a source connected to a common connection node, and a third MOS transistor having a gate connected to the second address signal, a drain connected to the common connection node and a source connected to a ground potential.

The semiconductor memory device may further include a fourth MOS transistor element having a gate connected to the first row address signal, a drain connected to the main word line, and a source connected to the common connection node.

In order to achieve still another aspect of the present invention, a semiconductor memory device includes a series circuit composed of a drive MOS transistor and a reset MOS transistor connected in series via a common connection node, a source of the reset MOS transistor being connected to a lower potential power supply, a main word line, a sub-word line connected to the common connection node, a row address signal section for decoding a first part of an address signal to generate a first row address signal and a second row address signal having a phase inverse to that of the first row address signal in accordance with the decoding result, and for supplying the first row address signal to a drain of the drive MOS transistor and the second row address signal to a gate of a reset MOS transistor, the address signal elements have the same conduction type, i.e., is composed of NMOS transistors.

BRIEF DESCRIPTION OF THE DRAWINGS

FIG. 10 a logic table showing the input/output relation of the circuit section of FIG. 8;

DESCRIPTION OF THE PREFERRED EMBODIMENTS

The semiconductor memory device of the present invention will be described below in detail with reference to the accompanying drawings.

Figure 1:
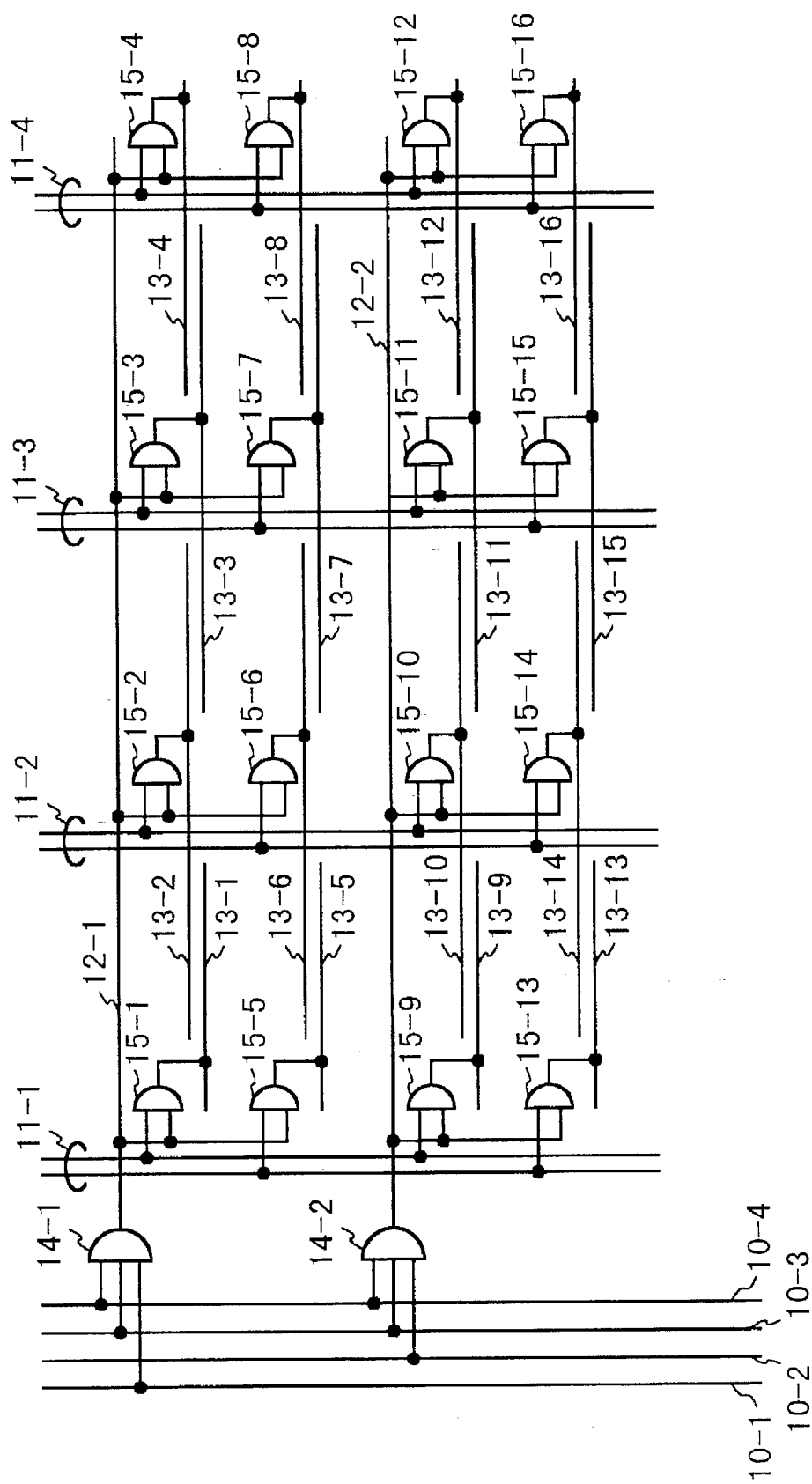
FIG. 1 is an outlined block diagram of a conventional semiconductor memory device such as a DRAM having a word line hierarchy structure.
Figure 2:
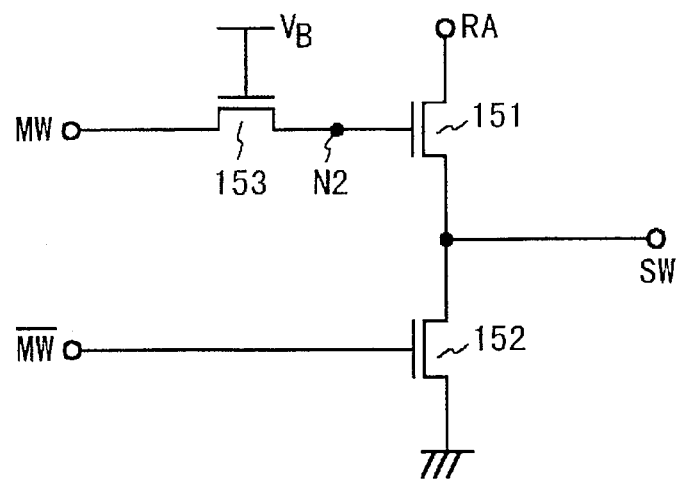
FIG. 2 is a circuit diagram which shows the structure of a divisional decoder used in a conventional semiconductor memory device.
Figure 3:
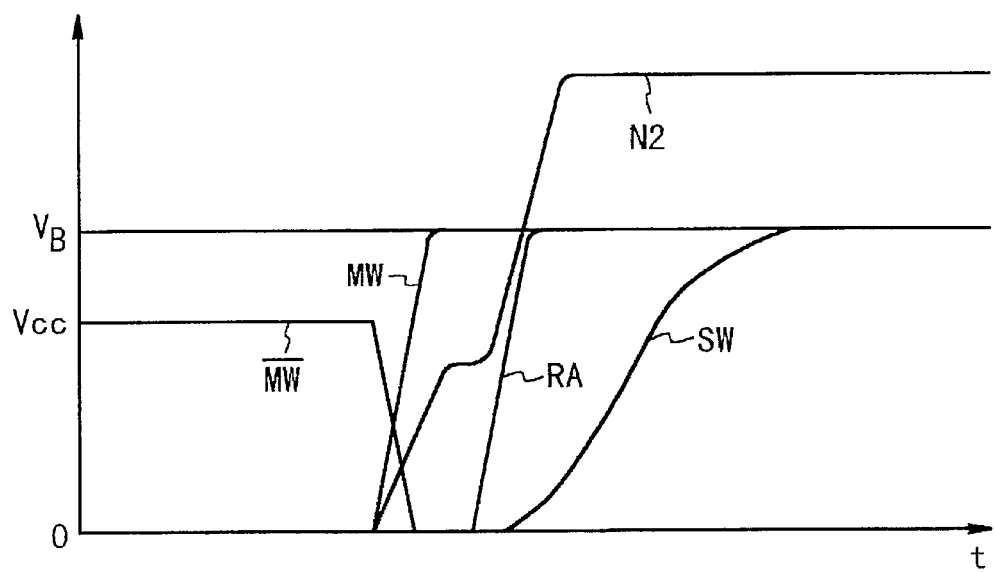
FIG. 3 is a diagram which shows examples of wave form of signals at points of the circuit of FIG. 2.
Figure 4:
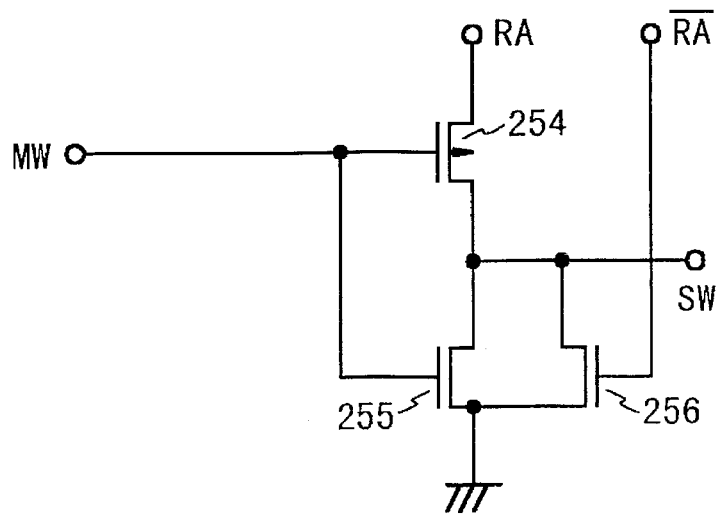
FIG. 4 is a circuit diagram which shows the structure of a divisional decoder used in another conventional semiconductor memory device.

FIG. 1 is a circuit diagram illustrating the structure of a divisional decoder circuit and its peripheral circuit section of a semiconductor memory device according to the first embodiment of the present invention. In FIG. 1, the divisional decoder circuit is composed of four NMOS transistors 1 to 4. The NMOS transistor 2 is a drive transistor for selecting a sub-word line SW and the NMOS transistor 1 is a transfer gate transistor for controlling the potential supply of a main word line MW to the gate of the NMOS transistor 2. Also, the NMOS transistor 3 is a reset transistor for the non-selected state of the sub-word line SW and the NMOS transistor 4 is a floating prevention transistor for the non-selected state of the sub-word line SW. A main decoder circuit 31 and a row address decoder circuit 32 are provided around of the divisional decoder circuit. The main word line MW is connected to the drain of the NMOS transistor 1 and the gate of the NMOS transistor 1 is applied with a fixed voltage VB enough to make the NMOS transistor 1 always turn on, and the source of the NMOS transistor 1 functions as a gate input of the NMOS transistor 2. The address signal RA is supplied to the drain of the NMOS transistor 2 and the sub-word line is connected to the source of the NMOS transistor 2. The phase inverted signal (inverted RA) of the address signal RA is applied to the gate of the NMOS transistor 3 and the source of the NMOS transistor 3 is grounded. The sub-word line SW is connected to the drain of the NMOS transistor 3. The main word line MW is also connected to the drain of the NMOS transistor 4. The address signal RA is applied to the gate of the NMOS transistor 4. The sub-word line SW is connected to the source of the NMOS transistor 4.

Next, the operation of the semiconductor memory device according to the first embodiment of the present invention will be described.

In brief, in a case where a sub-word line is to be set to a selected state, the potential of a main word line is set to an H level to drive the gate of a drive transistor. An address signal of the drain of the drive transistor is driven to the H level to drive a sub-word line connected to the source to the H level. In a case where the sub-word line is to be reset to a non-selected state, the address signal is set to the H level and the phase inverted signal is set to the L level, so that the sub-word line is reset to a reset potential by both of a reset transistor and the drive transistor. In a case where the sub-word line is to be held at the reset potential, the potential of the main word line and the address signal are both set to the L level and the phase inverted signal of the address signal is set to the H level. When the potential of the main word line is in the L level and the address signal is in the H level, a floating prevention transistor having been provided is turned on to prevent the sub-word line from floating to maintains the reset state.

Figure 8:
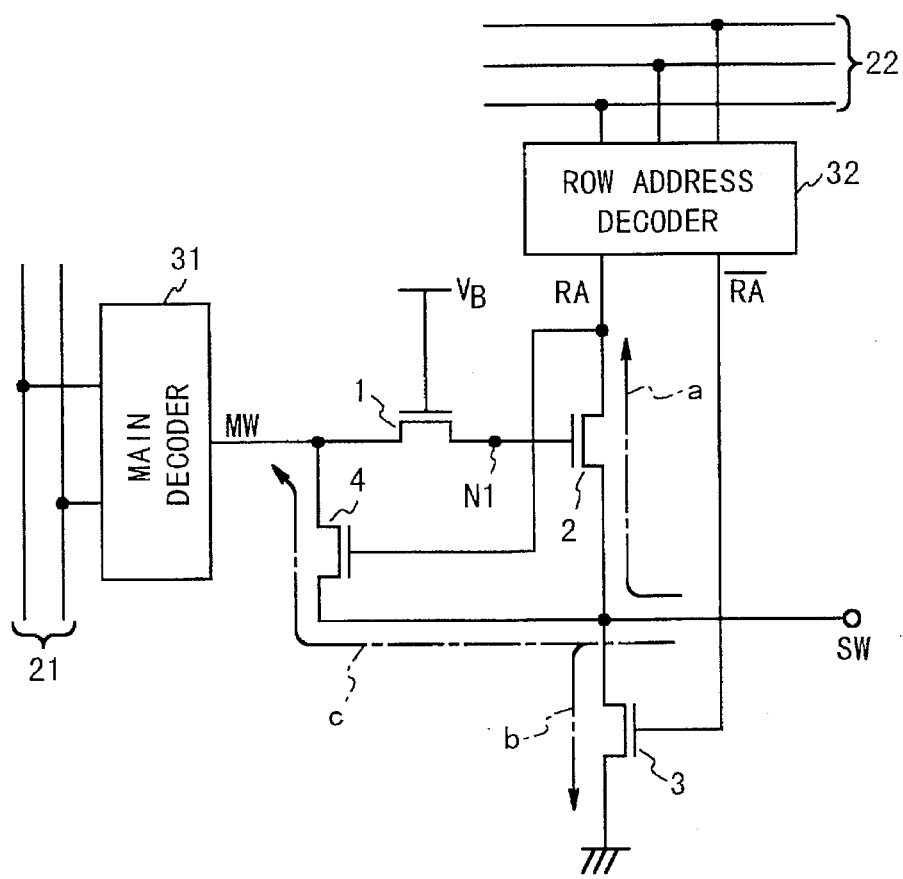
FIG. 8 is a circuit diagram illustrating the structure of a divisional decoder circuit section of a semiconductor memory device according to a first embodiment of the present invention.
Figure 9:
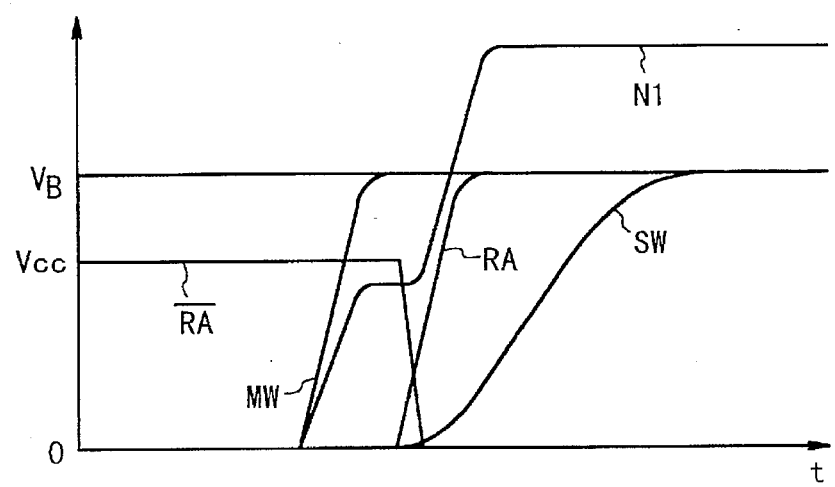
FIG. 9 is a diagram which shows examples of wave form of signals at points of the circuit section of FIG. 8.

FIG. 9 is a diagram showing wave form examples of signals of the respective points of the circuit section shown in FIG. 8. The operation of the semiconductor memory device will be described in detail with reference to FIG. 9.

In a case where the sub-word line SW is to be selected, a part 21 of row address signals is decoded by a main decoder 31 and the potential of the main word line MW is first set to the H level and is transferred to the gate of the NMOS transistor 2 (a node N1) through the NMOS transistor 1 because the transfer gate transistor 1 is always turned on. Then, a part 22 of the remaining row address signals is decoded by a row address decoder 32 and the address signal RA is set to the H level and the phase inverted signal is set to the L level. As a result, the reset transistor 3 is turned off. Since the drive transistor 2 has been turned on, the sub-word line SW is driven to the H level by the drive transistor 2. In this case, the node N1 which is the gate of the drive transistor 2 is raised (boosted) higher than the VB level by the operation of the transfer gate transistor 1 and, therefore, the source potential of the NMOS transistor 2, i.e., the potential of the sub-word line SW is set to the H level (the VB level) sufficiently.

In a case where the sub-word line SW is to be reset to the non-selected state, the address signal RA is set to the L level and the phase inverted signal is set to the H level. As a result, the reset transistor 3 is turned on to reset the potential of the sub-word line SW to the ground potential.

Next, in a case where a this sub-word line SW is to be held to the L level (the reset condition), the voltage of the main word line MW is set to the H level. Also, the address signal RA is set to the L level and the phase inverted signal is set to the H level. As a result, the NMOS transistor 2 and the NMOS transistor 3 are both turned on such that the sub-word line SW is connected to the address signal RA of the L level through the NMOS transistor 3. Therefore, the sub-word line SW is held to the reset state.

When the main word line MW is set to the L level, the address signal RA is set to the L level and the phase inverted signal is set to the H level, the NMOS transistor 3 is turned on. As a result, because the NMOS transistor 4 is turned off, the sub-word line SW becomes the ground potential through the NMOS transistor 3 and is maintained to the L level.

If the main word line MW is in the L level, the address signal RA is in the H level and the phase inverted signal is in the L level, the NMOS transistor 4 is turned on. As a result, because the sub-word line SW is connected to the main word line MW of the L level through the NMOS transistor 4, the sub-word line SW is maintained to the L level.

FIG. 10 shows the relation of logic levels of the main word line MW, the address signal RA, and the sub-word line SW. Also, the pull up or down state of the sub-word line SW in each case and the paths (arrow a-c of dot and dashed lines in FIG. 1) are shown. In this circuit, MOS transistors of the identical conductive type are entirely used. Also, it is not required to use the phase inverted signal of the main word line MW. Further, at the time of any condition, the sub-word line SW never becomes the floating state.

Figure 11:
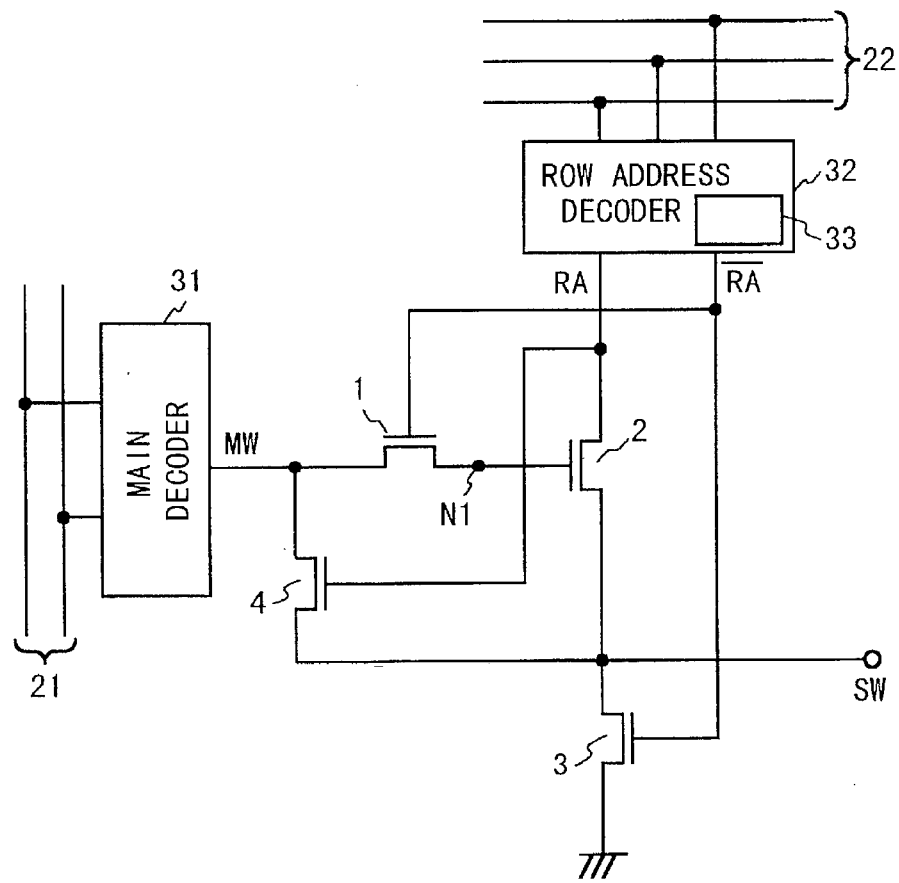
FIG. 11 is a circuit diagram illustrating the structure of a divisional decoder circuit section of a semiconductor memory device according to a second embodiment of the present invention.

FIG. 11 is a diagram illustrating the semiconductor memory device according to the second embodiment of the present invention. In FIG. 11, the same components as in FIG. 8 are illustrated with the identical reference numerals. Therefore, only a portion of FIG. 11 which is different from FIG. 8 will be described. In FIG. 11, the gate of the NMOS transistor 1 is connected to the phase inverted signal (inverted RA) of the address signal RA in place of the fixed voltage VB. The phase inverted signal is generated by the row address decoder 32 and the high level of the phase inverted signal is boosted to the fixed voltage VB by a boosting circuit 33. The other portions are the same as in FIG. 8.

Figure 12:
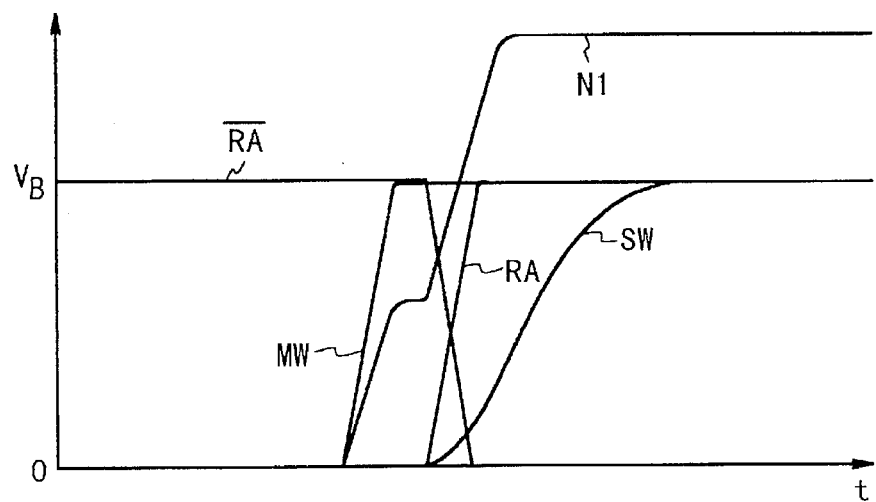
FIG. 12 is a diagram which shows examples of wave form of signals at points of the circuit section of FIG. 11.

Next, the operation of the semiconductor memory device of the second embodiment of the present invention will be described. FIG. 12 is a diagram showing wave form examples of the respective points of the circuit section shown in FIG. 11.

In a case where the sub-word line SW is to be selected, the potential of the main word line MW is first set to the H level and then the address signal RA is set to the H level. Since the phase inverted signal is set to the H level in an initial state, the gate potential (the potential of N1) of the drive transistor 2 is boosted by the main word line signal. In this case, the phase inverted signal of the address signal becomes the L level at the same time when the address signal RA is set to the H level, the NMOS transistor 1 is turned off. As a result, the gate potential of the NMOS transistor 2 cannot be dropped from the boosted level, resulting in good efficiency. In the second embodiment, the power supply line VB connected to the gate of the NMOS transistor 1 in FIG. 8 is not required. Therefore, the chip area can be effectively used when the semiconductor memory device is achieved as an IC. The other operations are the same as in FIG. 8.

Figure 5:
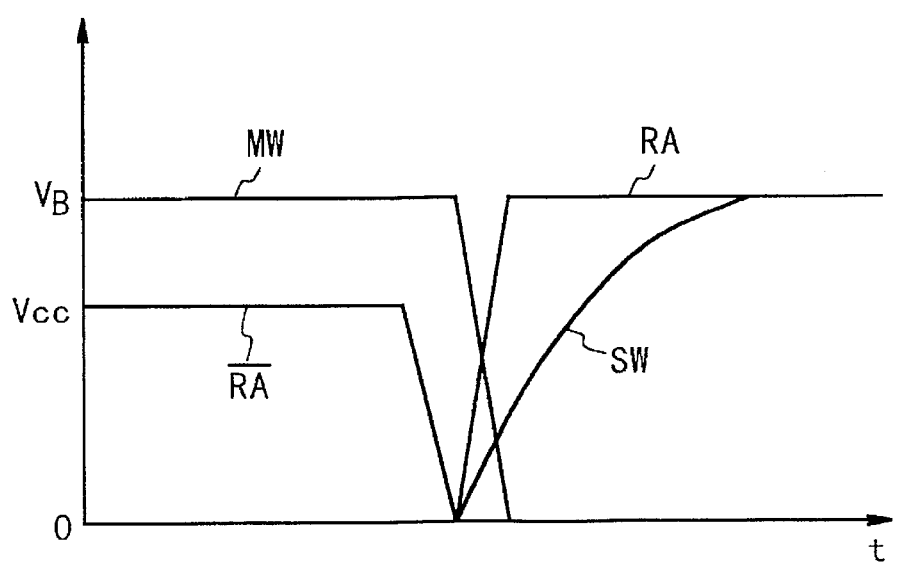
FIG. 5 is a diagram which shows examples of wave form of signals at points of the circuit of FIG. 4.
Figure 6:
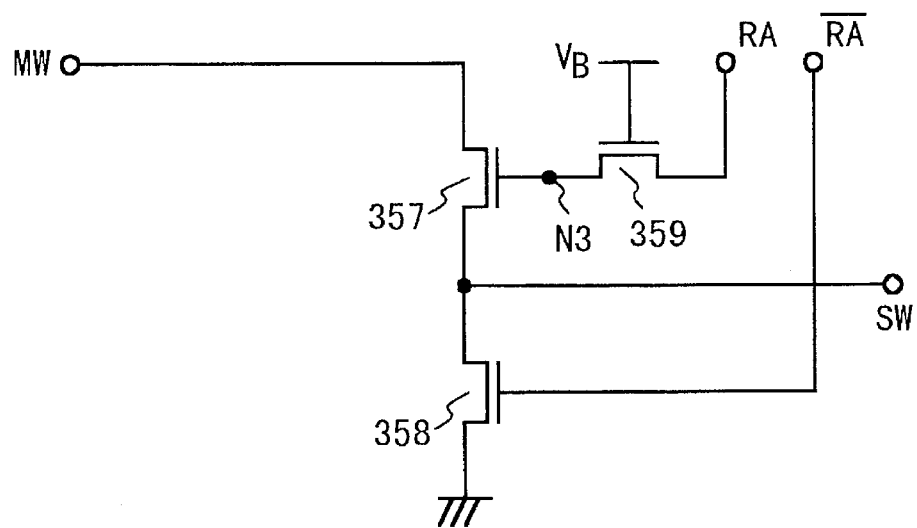
FIG. 6 is a circuit diagram which shows the structure of a divisional decoder used in still another conventional semiconductor memory device.
Figure 7:
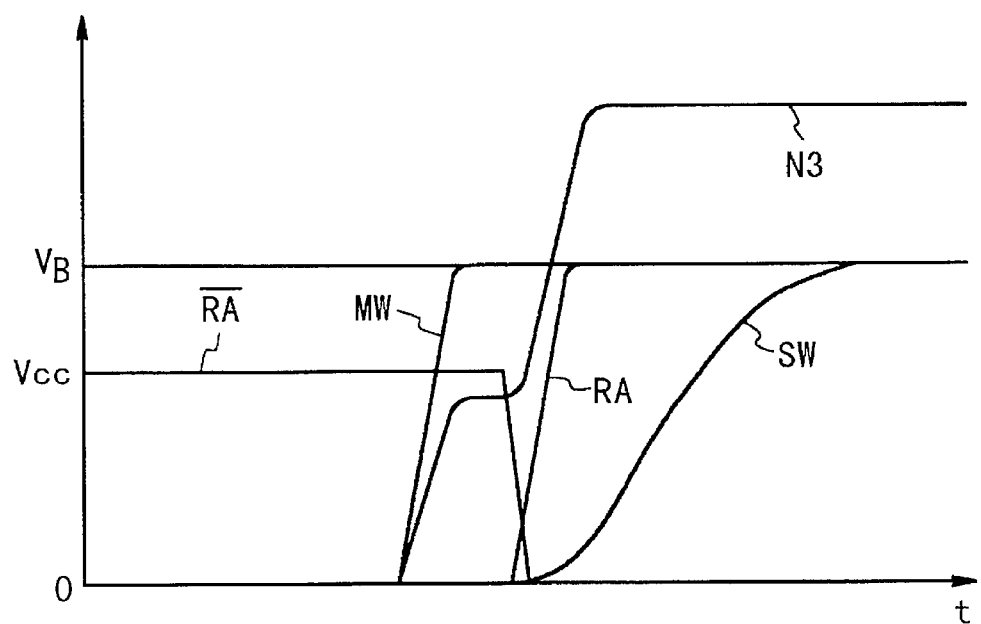
FIG. 7 is a diagram which shows examples of wave form of signals at points of the circuit of FIG. 6.

In the first embodiment shown in FIG. 8, the H level of the phase inverted signal of the address signal may be a level sufficient to make the NMOS transistor 3 turn on. Therefore, the H level may be a VCC level (VB>VCC), as shown in FIG. 9. However, in the second embodiment shown in FIG. 11, the H level of the phase inverted signal of the address signal is made to be VB, as shown in FIG. 5, in order to make the transfer gate NMOS transistor 1 sufficiently turn on such that the gate of the NMOS transistor 2 is sufficiently boosted.

As described above, according to the present invention, a divisional decoder is composed of the MOS transistors all having the identical conductive type, i.e., NMOS transistors. Therefore, any element separating region is not required. Also, the phase inverted signal of the main word line is not used. Therefore, the problem on leak current is solved. Further, it is made possible to input the address signal to the drain of the NMOS transistor. Therefore, the load of the address signal is small. Further, because the floating prevention transistor is provided between the main word line and the sub-word line. Therefore, there is no case of floating of the sub-word line.

What is claimed is:

1. A semiconductor memory device comprising:

a main word line;

a sub-word line;

a main decoder circuit for decoding a first part of an address signal to output a main word line signal to said main word line in accordance with the decoding result, said address signal including said first part and a second part;

address signal decoding means for decoding a part of said second part of said address signal to generate a first row address signal and a second row address signal having a phase inverse to that of said first row address signal in accordance with the decoding result;

a first MOS transistor element having a gate connected to a predetermined voltage, a drain connected to said main word line and a source;

a second MOS transistor element having a gate connected to said source of said first MOS transistor, a drain connected to said first row address signal, and a source connected to a common connection node; and a third MOS transistor element having a gate connected to said second address signal, a drain connected to said common connection node and a source connected to a ground potential.

2. A semiconductor memory device according to claim 1, further comprising a fourth MOS transistor element having a gate connected to said first row address signal, a drain connected to said main word line, and a source connected to said common connection node.

3. A semiconductor memory device according to claim 2, wherein said first to fourth MOS transistor elements have the same conduction type.

4. A semiconductor memory device according to claim 3, wherein said first to fourth MOS transistor elements are NMOS transistors.

5. A semiconductor memory device comprising:

a main word line;

a sub-word line;

a main decoder circuit for decoding a first part of an address signal to output a main word line signal to said main word line in accordance with the decoding result, said address signal including said first part and a second part;

address signal decoding means for decoding a part of said second part of said address signal to generate a first row address signal and a second row address signal having a phase inverse to that of said first row address signal in accordance with the decoding result;

a first MOS transistor element having a gate connected to said first row address signal, a drain connected to said main word line and a source;

a second MOS transistor element having a gate connected to said source of said first MOS transistor, a drain connected to said first row address signal, and a source connected to a common connection node; and a third MOS transistor element having a gate connected to said second address signal, a drain connected to said common connection node and a source connected to a ground potential.

6. A semiconductor memory device according to claim 5, further comprising a fourth MOS transistor element having a gate connected to said first row address signal, a drain connected to said main word line, and a source connected to said common connection node.

7. A semiconductor memory device according to claim 6, wherein said first to fourth MOS transistor elements have the same conduction type.

8. A semiconductor memory device according to claim 7, wherein said first to fourth MOS transistor elements are NMOS transistors.

9. A semiconductor memory device according to claim 5, wherein said address signal decoding means further includes means for boosting a high level of said second row address signal to a boosted voltage higher than a higher potential power supply.

10. A semiconductor memory device comprising:

a series circuit composed of a drive MOS transistor and a reset MOS transistor connected in series via a common connection node, a source of said reset MOS transistor being connected to a lower potential power supply;

a main word line;

a sub-word line connected to said common connection node;

row address signal means for decoding a first part of an address signal to generate a first row address signal and a second row address signal having a phase inverse to that of said first row address signal in accordance with the decoding result, and for supplying said first row address signal to a drain of said drive MOS transistor and said second row address signal to a gate of a reset MOS transistor, said address signal including said first part and a second part;

a main decoder circuit for decoding said second part of said address signal to output a main word line signal to said main word line in accordance with the decoding result before said row address signal means supplies said first and second row address signals; and transfer means for transferring said main word line signal to a gate of said drive MOS transistor.

11. A semiconductor memory device according to claim 10, wherein said row address signal means further includes means for boosting a high level of said second row address signal to a boosted voltage higher than a higher potential power supply.

12. A semiconductor memory device according to claim 11, wherein said transfer means further includes a transfer MOS transistor having a gate is connected to said second row address signal, a drain connected to said main word line and a source connected to a gate of said drive MOS transistor.

13. A semiconductor memory device according to claim 10, wherein said transfer means further includes a transfer MOS transistor having a gate connected to a predetermined voltage higher than a higher potential power supply, a drain connected to said main word line and a source connected to a gate of said drive MOS transistor.

14. A semiconductor memory device according to claim 10, further comprising preventing means for preventing said sub-word line from floating when said main word line signal is in a low level.

15. A semiconductor memory device according to claim 14, wherein said preventing means includes a floating prevention MOS transistor having a gate connected to said first row address signal, a drain connected to said main word line, and a source connected to said common connection node.

16. A semiconductor memory device according to claim 15, wherein said first to fourth MOS transistors have the same conduction type.

17. A semiconductor memory device according to claim 16, wherein said first to fourth MOS transistors are NMOS transistors.

18. A semiconductor memory device according to claim 12, further comprising preventing means for preventing said sub-word line from floating when said main word line signal is in a low level.

19. A semiconductor memory device according to claim 18, wherein said preventing means includes a floating prevention MOS transistor having a gate connected to said first row address signal, a drain connected to said main word line, and a source connected to said common connection node.

20. A semiconductor memory device according to claim 13, further comprising preventing means for preventing said sub-word line from floating when said main word line signal is in a low level.

21. A semiconductor memory device according to claim 20, wherein said preventing means includes a floating prevention MOS transistor having a gate connected to said first row address signal, a drain connected to said main word line, and a source connected to said common connection node.

* * * * *